(12) United States Patent
Hatakeyama

(10) Patent No.: US 9,202,956 B2
(45) Date of Patent: Dec. 1, 2015

(54) BACK SHEET FOR SOLAR CELL AND PROCESS FOR PRODUCTION THEREOF, AND SOLAR CELL MODULE

(71) Applicant: FUJIFILM Corporation, Tokyo (JP)

(72) Inventor: Akira Hatakeyama, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 13/890,696

(22) Filed: May 9, 2013

(65) Prior Publication Data

US 2013/0240036 A1 Sep. 19, 2013

Related U.S. Application Data

(63) Continuation of application No. PCT/JP2011/076108, filed on Nov. 11, 2011.

(30) Foreign Application Priority Data

Nov. 12, 2010 (JP) ................................. 2010-254208

(51) Int. Cl.
| | |
|---|---|
| H01L 31/048 | (2014.01) |
| H01L 31/18 | (2006.01) |
| H01L 31/049 | (2014.01) |
| B32B 27/08 | (2006.01) |
| B32B 27/12 | (2006.01) |
| B32B 27/30 | (2006.01) |
| B32B 27/36 | (2006.01) |
| C08J 7/04 | (2006.01) |

(52) U.S. Cl.
CPC ............ *H01L 31/0487* (2013.01); *B32B 27/08* (2013.01); *B32B 27/12* (2013.01); *B32B 27/306* (2013.01); *B32B 27/36* (2013.01); *C08J 7/042* (2013.01); *C08J 7/047* (2013.01); *H01L 31/049* (2014.12); *H01L 31/18* (2013.01); *B32B 2255/10* (2013.01); *B32B 2255/26* (2013.01); *B32B 2262/101* (2013.01); *B32B 2457/12* (2013.01); *C08J 2367/02* (2013.01); *C08J 2427/14* (2013.01); *C08J 2429/04* (2013.01); *C08J 2483/04* (2013.01); *Y02E 10/50* (2013.01); *Y10T 428/24967* (2015.01)

(58) Field of Classification Search
CPC ........................... H01L 31/0487; H01L 31/18
See application file for complete search history.

(56) References Cited

U.S. PATENT DOCUMENTS

| | | | | |
|---|---|---|---|---|
| 2011/0100415 A1* | 5/2011 | Osamura et al. | ............... | 136/244 |
| 2011/0132454 A1* | 6/2011 | Lin et al. | ........................ | 136/256 |
| 2011/0247683 A1 | 10/2011 | Watanabe et al. | | |
| 2011/0277834 A1* | 11/2011 | Hatakeyama et al. | ........ | 136/256 |
| 2011/0297221 A1* | 12/2011 | Jeong et al. | .................... | 136/256 |
| 2012/0048348 A1* | 3/2012 | Aritoshi et al. | ............... | 136/251 |

FOREIGN PATENT DOCUMENTS

| | | | |
|---|---|---|---|
| CN | 101661962 A | * | 3/2010 |
| JP | 2006210557 A | | 8/2006 |
| JP | 201020601 A | | 1/2010 |
| JP | A2010-199555 | | 9/2010 |
| JP | 2010-232201 A | | 10/2010 |
| JP | 2010-238759 A | | 10/2010 |
| JP | 2010-238760 A | | 10/2010 |
| JP | A2010-238727 | | 10/2010 |
| JP | 2011165967 A | | 8/2011 |
| WO | 2009/097024 A1 | | 8/2009 |
| WO | WO 2010087684 A2 | * | 8/2010 |

OTHER PUBLICATIONS

Notice of Reasons for Rejection, issued by JPO on Sep. 9, 2014 in connection with corresponding Japanese Patent Application No. 2011-247870.

Notice of Reasons for Rejection issued by the Japanese Patent Office (JPO) on Nov. 18, 2014 in connection with Japanese Patent Application No. 2011-247870.

First Office Action issued by the State Intellectual Property Office (SIPO) of China on Feb. 4, 2015 in connection with Chinese Patent Application No. 201180053984.4.

* cited by examiner

*Primary Examiner* — Ling Choi
*Assistant Examiner* — Catherine S Branch
(74) *Attorney, Agent, or Firm* — Jean C. Edwards, Esq.; Edwards Neils PLLC

(57) ABSTRACT

A solar cell backsheet including: a support which has a thickness of 120 μm to 350 μm; a first polymer layer which is formed on one surface of the support by coating, which includes a polymer, and which has a thickness of 0.5 μm to 12.0 μm; and a second polymer layer which is formed, by coating, on the opposite side of the side of the support provided with the first polymer layer, which includes a fluorinated resin or a silicone-based resin, and which has a thickness of 0.2 μm to 15.0 μm.

17 Claims, No Drawings

BACK SHEET FOR SOLAR CELL AND PROCESS FOR PRODUCTION THEREOF, AND SOLAR CELL MODULE

CROSS-REFERENCE TO RELATED APPLICATIONS

This application is a continuation application of, and claims priority to, International Application No. PCT/JP/2011/076108, filed Nov. 11, 2011, which was published under PCT Article 21(2) in Japanese, which is incorporated herein by reference. Further, this application claims priority from Japanese Patent Application No. 2010-254208, filed Nov. 12, 2010, which is incorporated herein by reference.

BACKGROUND OF THE INVENTION

1. Technical Field

The present invention relates to a backsheet for a solar cell which is to be disposed on a side which is opposite to a side of a photovoltaic element to which solar light incidents, a method for producing the backsheet, and a solar cell module.

2. Background Art

Solar cells are recently rapidly become popular because the cells do not emit carbon dioxide during the generation of electricity and are more environment-friendly.

Solar cell modules usually include a photovoltaic element (cell) disposed between a top surface glass, on which solar light is incident and a solar cell backsheet (hereinafter simply referred to as "backsheet") on the opposite side from the side on which solar light is incident (on the backside). The solar cell modules include an encapsulant such as an ethylene-vinyl acetate (EVA) resin in a space between the top surface glass and the photovoltaic element (cell) and a space between the photovoltaic element (cell) and the backsheet.

The backsheet acts to prevent intrusion of moisture from the backside of a solar cell module. Although glass, fluorinated resin, and the like have been conventionally used for the backsheet, polyester is increasingly used in view of cost reduction.

In recent years, attempts have been made to raise the driving voltage of a solar cell module in order to reduce a size of a solar cell module apparatus and improve its efficiency.

Thus, there is an increasing demand for a solar cell backsheet to have a high dielectric strength in terms of safety. In recent years, a backsheet has been requested to have a dielectric strength of 600 V or more and further 1000 V or more. Correspondingly, a backsheet has been requested to have a thickness of 125 μm or more and further 250 μm or more.

A backsheet may be more than a mere polymer sheet and may be provided with various functions. For example, it may be requested to provide a backsheet which has a reflective performance by having a functional layer which includes white inorganic particles such as titanium oxide and is disposed on its polymer sheet (support) to. Such backsheet improves efficiency of power generation by diffusely reflecting (hereinafter simply referred to as "reflect") solar light which falls on a top surface of a solar cell module and passes through a cell thereby returning the light into the cell.

A back surface protection sheet which includes a white ink layer including a white pigment is disclosed (see, for example, Japanese Patent Application Laid-Open (JP-A) No. 2006-210557).

A protection sheet for a solar cell module, the sheet including, as another functional layer, a weatherproof layer including a fluorine-containing resin is disclosed (see, for example, JP-A No. 2010-20601).

(JP-A No. 2011-165967 discloses a backsheet having a polymer substrate which includes a small amount of white inorganic particles and a reflection layer which is formed on the polymer substrate by coating and which includes a binder and white inorganic particles in a specified ratio.

International Patent Application Publication WO2009/097024 discloses a backsheet including a layer which includes fluoropolymer cured on a substrate and which further includes hydrophobic silica.

SUMMARY OF INVENTION

Problems to be Solved by the Invention

To thicken a backsheet so that the backsheet can exhibit a high dielectric strength, it is required to thicken its support as described above. On the other hand, a functional layer provided in a backsheet is formed by sticking material sheets such as a white sheet which includes white inorganic particles and a fluororesin sheet with each other. Namely, a conventional backsheet is typically formed by sticking a polyester support, a white sheet, a fluororesin sheet, and the like with each other. In a backsheet formed by sticking functional layers, however, the sheets which are to be a functional layer may heat-shrink and warp due to heat applied to the backsheet during production of a solar cell module. Depending on differences in the degree of thermal shrinkage of sticked plural material sheets, the warps may become more significantly warp.

A backsheet is also requested to have high damp heat resistance. Usually, urethane adhesives are used to stick the material sheets with each other. Because these adhesives are subject to hydrolysis, separation may occur between material sheets and/or between a material sheet and a support after damp heat aging.

Further, the heat shrinkage of the material sheet induces mechanical residual stress at the interface between the material sheet and the support. This may also contribute to separation between material sheets and/or between a material sheet and a support after damp heat aging.

In JP-A No. 2006-210557 and JP-A No. 2010-20601, a part of functional layers are formed by coating. However, since a process for producing the backsheet includes sticking sheets with each other, warps and separation between material sheets and/or between a material sheet and a support occur during heat treatment in the production process of a solar cell and after damp heat aging of the solar cell.

The present invention may provide a solar cell backsheet which is less likely to warp even under hot-pressing and/or damp heat aging and which includes a polymer layer less likely to separate from an encapsulant and/or a support, a method for producing the backsheet, and a solar cell module which has a high yield.

Means of Solving the Problems

Specific means of solving the problems described above are as follows:

<1> A backsheet for a solar cell, the backsheet comprising:
a support which has a thickness of 120 μm to 350 μm;
a first polymer layer which is formed on one surface of the support by coating, which comprises a polymer, and which has a thickness of 0.5 μm to 12.0 μm; and
a second polymer layer which is formed on a surface on an opposite side from the surface of the support on which the first polymer layer is provided by coating, which comprises a fluorinated resin or a silicone-based resin, and which has a thickness of 0.2 μm to 15.0 μm.

<2> The backsheet according to <1>, wherein the support comprises a polyester.

<3> The backsheet according to <1> or <2>, wherein a surface of the backsheet at which the first polymer layer is provided with has a light reflectance at 550 nm of 72% or more.

<4> The backsheet according to any one of <1> to <3>, wherein the support has a thickness of 160 μm to 320 μm.

<5> The backsheet according to any one of <1> to <4>, wherein the first polymer layer has a thickness of 1 μm to 10 μm.

<6> The backsheet according to any one of <1> to <5>, wherein the second polymer layer has a thickness of 0.5 μm to 12 μm.

<7> The backsheet according to any one of <1> to <6>,
wherein the support has a thickness of 160 μm to 320 μm,
wherein the first polymer layer has a thickness of 1 μm to 10 μm, and
wherein the second polymer layer has a thickness of 0.5 μm to 12 μm.

<8> The backsheet according to any one of <1> to <7>, wherein the polymer which is included in the first polymer layer comprises at least one selected from the group consisting of a vinyl alcohol resin, an olefin resin, and an acrylic resin.

<9> The backsheet according to any one of <1> to <8>, wherein the second polymer layer comprises the silicone-based resin, and wherein the silicone-based resin is a composite polymer of a silicone resin and an acrylic resin.

<10> The backsheet according to any one of <1> to <9>, wherein the first polymer layer has an adhesion to an encapsulant which encapsulates a photovoltaic element of the solar cell of 10 N/cm or more.

<11> The backsheet according to <10>, wherein the encapsulant which encapsulates the photovoltaic element of the solar cell comprises ethylene-vinyl acetate.

<12> The backsheet according to any one of <1> to <11>, wherein the support has a ratio of an elongation at break after 50 hours of storage at 120° C. and 100% RH, to an elongation at break before the storage, of 50% or more.

<13> The backsheet according to any one of <1> to <12>, wherein all layers which constitute the backsheet except for the support are formed by coating.

<14> A solar cell module comprising the backsheet according to any one of <1> to <13>.

<15> A method for producing the backsheet according to any one of <1> to <13>, comprising:
coating a first coating liquid which comprises a polymer to one surface of a support having a thickness of 120 μm to 350 μm to form a first polymer layer having a thickness of 0.5 μm to 12.0 μm; and
coating a second coating liquid which comprises a fluorinated resin or a silicone-based resin to a surface on an opposite side from the surface of the support on which the first polymer layer is provided to form a second polymer layer having a thickness of 0.2 μm to 15.0 μm.

<16> The method according to <15>, wherein all layers which constitute the backsheet except for the support are formed by coating.

Effects of the Invention

The present invention can provide a solar cell backsheet which is less likely to warp even under hot-pressing and damp heat aging and which is less likely to cause separation of its polymer layer to separate from an encapsulant and/or its support, a method for producing the backsheet, and a solar cell module which has a high yield.

DESCRIPTION OF EMBODIMENTS

The solar cell backsheet, the method for producing the backsheet, and the solar cell module, which are embodiments of the present invention, will be described below in detail.

As used herein, "step" encompasses not only an independent step, but a step which is unable to be specifically distinguished from another step, as long as such step can achieve its desired effects.

The recitation of a numerical range by endpoints ("from m to n" or "m to n") includes the lower endpoint (m) as its minimum value and the upper endpoint (n) as its maximum value.

In a case in which plural materials which correspond to a certain component in a composition, an amount of the component specified in this description means the total amount of the plural materials which exist in the component, unless otherwise defined.

<Solar Cell Backsheet and Method for Producing the Backsheet>

The backsheet of the present disclosure is a backsheet for a solar cell, the backsheet including at least: a support which has a thickness of 120 μm to 350 μm; a first polymer layer which is formed on one surface of the support by coating, which includes a polymer, and which has a thickness of 0.5 μm to 12.0 μm; and a second polymer layer which is formed on a surface on an opposite side from the surface of the support on which the first polymer layer is provided by coating, which includes a fluorinated resin or a silicone-based resin, and which has a thickness of 0.2 μm to 15.0 μm.

The backsheet having the configuration may be less likely to warp even under heat and pressure and/or damp heat aging and may be less likely to cause separation of its polymer layer to separate from an encapsulant and/or its support.

In one embodiment, the backsheet may be used for a solar cell produced by hot-pressing at 130° C. or more, and includes: a polyester support (hereinafter simply referred to as a "support") which has a thickness of 120 μm to 350 μm; a first polymer layer which is formed on one surface of the polyester support by coating, which includes a polymer, and which has a thickness of 0.2 μm to 8.0 μm and an adhesion to an encapsulant which encapsulates a photovoltaic element of the solar cell of 10 N/cm or more; and a second polymer layer which is formed on another side of the polyester support by coating, which includes a fluorinated resin or a silicone-based resin, and which has a thickness of 0.5 μm to 8.0 μm.

The effects described above are expected to be achieved because of the following reasons.

A solar cell may be produced by hot-pressing, at 130° C. or more, a backsheet with an encapsulant for encapsulating a photovoltaic element of a solar cell.

In the case that a backsheet has a configuration in which a material sheet which is a functional layer for providing a function such as reflectivity is stuck to a support, the backsheet may warp in a hot-pressing step in the production process of the solar cell, and the material sheet may separate from the encapsulant and/or the support. This may occur because the support has a different thermal expansion coefficient than a material sheet such as a polymer layer formed on a support.

Because the support has a large thickness of 120 μm or more and a high thermal expansion, and a material sheet used for sticking also has a large thickness of, usually, 100 μm or more, hot-pressing may cause the material sheet to heat-shrink. When the material sheet heat-shrinks, the sheet may separate from an encapsulant and/or the support. Further, when the material sheet heat-shrinks with being stuck to the support, the backsheet may warp.

In a case in which the support, which is to be a backsheet substrate, has a large thickness of 120 μm or more, the support tends to retain heat, which may promote heat shrinkage of a material sheet stuck to the support.

Since a solar cell is usually installed outside such as over a roof, a backsheet is heated by direct solar light and exposed to rain. Therefore, the backsheet needs to be capable of withstanding use under damp heat conditions for a long time (for example at 120° C. and 100% RH for 50 hours). In a conventional backsheet formed by sticking of a material sheet and a support, however, the material sheet is likely to heat-shrink due to heat and then to separate from an encapsulant and/or the support, and the backsheet is likely to warp.

In contrast, in the backsheet of the present disclosure, both of the first polymer layer and the second layer, which are functional layers to provide a function to the backsheet, are formed by coating and have a thickness of 15.0 μm or less. Thus the functional layers may be less subject to heat. Even after hot-pressing at 130° C. or higher or a long-term damp heat aging (at 120° C. and 100% RH for 5 hours), the functional layers included in the backsheet of the present disclosure may be less likely to separate from an encapsulant and/or a support, and the backsheet may less likely to warp.

The support, the first polymer layer, and the second polymer layer included in the backsheet of the present disclosure will be described.

[Support]

The backsheet has a support having a thickness of 120 μm to 350 μm as a substrate. The support may or may not include a polyester. The support which includes a polyester can provide a remarkable warpage resistance even after hot-pressing and damp heat aging and an effect of preventing separation of the polymer layer from an encapsulant and/or the support Examples of the polyester include a linear saturated polyester synthesized from an aromatic diacid or an ester formable-derivative thereof and a diol or an ester formable-derivative thereof. Specific examples of such polyester include polyethylene terephthalate, polyethylene isophthalate, polybutylene terephthalate, poly(1,4-cyclohexylene dimethylene terephthalate), and polyethylene-2,6-naphthalate. Among them, polyethylene terephthalate and polyethylene-2,6-naphthalate are especially preferable in terms of the mechanical properties and cost balance.

The polyester may be a homopolymer or a copolymer. The support may further include a small amount of another kind of resin such as a polyimide by blending the polyester therewith.

In a case in which the polyester is polymerized, it is preferable to use a Sb compound, a Ge compound, or a Ti compound as a catalyst so that the carboxyl group content does not exceed a specified range. Among them, the Ti compound is especially preferable. In a case in which the Ti compound is used, the Ti compound is used as a catalyst preferably at 1 ppm to 30 ppm, and more preferably at 3 ppm to 15 ppm, to polymerize the polyester. Use of the Ti compound in an amount within the above range may allow adjustment of the terminal carboxyl group content to the range specified below and may allow the support to have a high hydrolysis resistance.

Examples of the process which can be used to synthesize the polyester using the Ti compound include those described in Japanese Examined Patent Publication No. 8-301198, Japanese Patent No. 2543624, Japanese Patent No. 3335683, Japanese Patent No. 3717380, Japanese Patent No. 3897756, Japanese Patent No. 3962226, Japanese Patent No. 3979866, Japanese Patent No. 3996871, Japanese Patent No. 4000867, Japanese Patent No. 4053837, Japanese Patent No. 4127119, Japanese Patent No. 4134710, Japanese Patent No. 4159154, Japanese Patent No. 4269704, and Japanese Patent No. 4313538.

The content of the carboxyl group in the polyester is preferably 50 eq./t or less, and more preferably 35 eq./t or less. The carboxyl group content of 50 eq./t or less may allow the hydrolysis resistance to be maintained and strength loss due to damp heat aging to be decreased. The lower limit of the carboxyl group content is desirably 2 eq./t so as to retain adhesion between the polyester support and a layer formed on the polyester (such as a colored layer).

The content of the carboxyl group in the polyester can be adjusted depending on a type of a polymerization catalyst and film-forming conditions such as the film-forming temperature and time.

The polyester is preferably solid phase polymerized after polymerization. A preferable carboxyl group content can be achieved thereby. The solid phase polymerization may be carried out by a continuous process in which a tower is filled with a resin and then heated to gently reflux for a predetermined period of time, and the resultant is discharged from the tower, or a batch process in which a resin is placed into a reactor and heated for a predetermined period of time. In particular, methods described in Japanese Patent No. 2621563, Japanese Patent No. 3121876, Japanese Patent No. 3136774, Japanese Patent No. 3603585, Japanese Patent No. 3616522, Japanese Patent No. 3617340, Japanese Patent No. 3680523, Japanese Patent No. 3717392, Japanese Patent No. 4167159, and the like may be applied for the solid phase polymerization process.

The solid phase polymerization is carried out preferably at 170° C. to 240° C., more preferably at 180° C. to 230° C., and still more preferably at 190° C. to 220° C. And the solid phase polymerization is carried out preferably for 5 hours to 100 hours, more preferably for 10 hours to 75 hours, and still more preferably for 15 hours to 50 hours. The solid phase polymerization is carried out preferably under vacuum or nitrogen atmosphere.

In a case in which the support includes the polyester, the polyester support is preferably a biaxially stretched film formed by, for example, melt-extruding the polyester described above to form a film; cooling and solidify the film on a casting drum to form an unstretched film; longitudinally stretching the unstretched film one or more times at the Tg to the (Tg+60)° C. so that a stretch ratio becomes 3 times to 6 times in total; and transversely stretching the resultant film at the Tg to the (Tg+60)° C. so that a stretch ratio becomes 3 times to 5 times in total.

Further, the film may or may not be heat-treated at 180° C. to 230° C. for one second to 60 seconds, as required.

The support has a thickness of 120 μm or more in terms of dielectric strength. In one embodiment, the support preferably has a thickness of 160 μm or more, more preferably 180 μm or more, and still more preferably 250 μm or more. Although the support having a larger thickness exhibits better dielectric strength, a support having a thickness of 350 μm or less is used in terms of handling property. In one embodiment, an upper limit of a thickness of the support is preferably 320 μm.

The support preferably has a ratio of elongation at break after 50 hours of storage at 120° C. and 100% RH, to elongation at break before the storage (hereinafter also referred to as a "retention of elongation at break"), of 50% or more. In a case in which the support which has a retention of elongation at break of 50% or more, changes which are accompanied with hydrolysis may be suppressed, and adherence at the interface with an adhered material may be stably retained in long term use, so that separation of a functional layer from the support after aging may be prevented. This allows, for example, the support to exhibit high durability even when the backsheet is placed under outdoor environment such as high temperature and high humidity environment and under exposure to light for a long time.

The retention of elongation at break is determined based on an elongation at break measured for the support which includes, on its surface, the first polymer layer and the second polymer layer(, and optionally, another layer as required).

The retention of elongation at break of the support is more preferably 60% or more, and still more preferably 70% or more, for the above reasons.

The method for determining the retention of elongation at break (%) is described in detail below.

[First Polymer Layer]

The backsheet includes a first polymer layer which is formed on one surface of the support by coating, which includes polymer, which has a thickness of 0.5 µm to 12.0 µm, and which has an adhesion to an encapsulant which encapsulates a photovoltaic element of 10 N/cm or more.

The first polymer layer acts as a readily adherable layer to ensure adhesion between an encapsulant and the backsheet. In an embodiment, the first polymer layer preferably has an adhesion to an encapsulant of 10 N/cm or more and more preferably 20 N/cm or more, because such adhesion levels can provide damp heat resistance sufficient to retain adhesion.

The backsheet can readily have such adhesion to an encapsulant which contains ethylene-vinyl acetate (EVA, an ethylene-vinyl acetate copolymer).

(Polymer)

Examples of the polymer included in the first polymer layer include a polyester, an urethane resin (polyurethane), an acrylic resin (polyacrylic), an olefin resin (polyolefin), a vinyl alcohol resin (polyvinyl alcohol), a silicone resin, and the like. The first polymer layer may contain at least one of these resins.

In terms of durability, acrylic resins and olefin resins are preferable.

In terms of adhesion, the first polymer layer preferably includes at least one selected from the group consisting of a polyester, a polyurethane, a vinyl alcohol resin, an olefin resin, a silicone resin, and an acrylic resin.

And a composite polymer of a silicone resin and an acrylic resin (a silicone-based resin) is also preferable.

Examples of the polyester include polyethylene terephthalate (PET) and polyethylene-2,6-naphthalate (PEN). The polyester for the polyester support as described above may also be used.

Examples of the urethane resin include a polymer formed of hexamethylene diisocyanate or toluene diisocyanate and ethylene glycol or propylene glycol.

Examples of the acrylic resin include JURYMER ET-410 and JURYMER SEK-301 (both trade names; manufactured by Nihon Junyaku Co., Ltd.).

Examples of the silicone-based resin include CERANATE WSA-1060 and CERANATE WSA-1070 (both trade names; manufactured by DIC Corp.) and POLYDUREX H-7620, POLYDUREX H-7630, and POLYDUREX H-7650 (all trade names; manufactured by Asahi Kasei Chemicals Corp.).

Examples of the olefin resin include CHEMIPEARL S-120 and CHEMIPEARL S-75N (both trade names; manufactured by Mitsui Chemicals, Inc.).

The vinyl alcohol resin may be any polymer compound which includes a vinyl alcohol monomer as a polymeric unit (polyvinyl alcohol, PVA). The vinyl alcohol resin may also be a modified polyvinyl alcohol such as a cation-modified polyvinyl alcohol, an anion-modified polyvinyl alcohol, and a silanol-modified polyvinyl alcohol. Among them, a silanol-modified polyvinyl alcohol is preferable. Examples of the commercially available polyvinyl alcohol include PVA-105 and PVA R-1130 (both trade names; manufactured by Kuraray Co., Ltd.).

The polymer is preferably applied in an amount of 0.3 g/m$^2$ to 13 g/m$^2$ and more preferably 0.4 g/m$^2$ to 11 g/m$^2$. In a case in which the binder is applied in an amount of 0.3 g/m$^2$ or more, the first polymer layer has adequate strength. In a case in which the polymer is applied in an amount of 13 g/m$^2$ or less, the first polymer layer is less likely to heat-shrink.

(Crosslinking Agent)

In addition to the polymer as described above, the first polymer layer preferably includes a crosslinking agent such as an epoxy crosslinking agent, an isocyanate crosslinking agent, an oxazolin crosslinking agent, or a carbodiimide crosslinking agent to further improve adhesion between an encapsulant and the backsheet.

Among them, a carbodiimide crosslinking agent and an oxazolin crosslinking agent are preferable in terms of adhesion after damp heat aging.

Specific examples of the carbodiimide crosslinking agent include N,N'-dicyclohexyl carbodiimide, N,N'-diisopropyl carbodiimide, 1-ethyl-3-(3-dimethylaminopropyl)carbodiimide hydrochloride, N-[3-(dimethylamino)propyl]-N'-ethyl carbodiimide, N-[3-(dimethylamino)propyl]-N'-propyl carbodiimide, and N-tert-butyl-N'-ethyl carbodiimide.

Commercial products of the carbodiimide crosslinking agent include CARBODILITE V-02-L2 (trade name, manufactured by Nisshinbo Chemical Inc.).

Specific examples of the oxazoline crosslinking agents include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-ethyl-2-oxazoline, 2,2'-bis-(2-oxazoline), 2,2'-methylene-bis-(2-oxazoline), 2,2'-ethylene-bis-(2-oxazoline), 2,2'-trimethylene-bis-(2-oxazoline), 2,2'-tetramethylene-bis-(2-oxazoline), 2,2'-hexamethylene-bis-(2-oxazoline), 2,2'-octamethylene-bis-(2-oxazoline), 2,2'-ethylene-bis-(4,4'-dimethyl-2-oxazoline), 2,2'-p-phenylene-bis-(2-oxazoline), 2,2'-m-phenylene-bis-(2-oxazoline), 2,2'-m-phenylene-bis-(4,4'-dimethyl-2-oxazoline), bis-(2-oxazolinylcyclohexane) sulfide, and bis-(2-oxazolinyl norbornane)sulfide. Additionally, a (co)polymer of these compounds can be also preferably used.

Commercially available oxazoline crosslinking agents which can be used include EPOCROS® WS-700 and EPOCROS® K-2020E manufactured by Nippon Shokubai Co., Ltd.

The first polymer layer preferably includes the crosslinking agent in an amount of from 0.5% by mass to 100% by mass, more preferably from 0.5% by mass to 50% by mass, and still more preferably from 5.0% by mass to 30.0% by mass, based on the total mass of the polymer which constitute the first polymer layer. In a case in which the first polymer layer includes the crosslinking agent in an amount of 0.5% by mass or more, the polymer layer has an adequate crosslinking effect while retaining strength and adhesion. In a case in which the first polymer layer includes the cros slinking agent in an amount of 100% by mass or less, and especially 50% by mass or less, a coating liquid for forming the polymer layer can have a longer pot life.

(White Pigment)

The first polymer layer preferably includes a white pigment.

Inclusion of the white pigment in the first polymer layer may allow the first polymer layer to exhibit a function as a reflection layer.

The white pigment can be appropriately selected from inorganic pigments such as titanium dioxide, barium sulfate, silicon oxide, aluminum oxide, magnesium oxide, calcium carbonate, kaolin, and talc. Among them, titanium dioxide is preferable.

An average volume particle size of the white pigment is preferably from 0.03 μm to 0.8 μm, and more preferably from about 0.15 μm to about 0.5 μm. In a case in which the white pigment has an average particle size within the range, the first polymer layer has a high light reflection efficiency. The average particle size is a value determined based on particle sizes measured by LA-950 LASER DIFFRACTION PARTICLE SIZE DISTRIBUTION ANALYZER (trade name, manufactured by Horiba, Ltd.).

The first polymer layer of the backsheet preferably has a light reflectance at 550 nm of 72% or more. In a case in which the first polymer layer has 72% or more of a light reflectance at 550 nm, the polymer layer can efficiently return, to a photovoltaic element, incident light such as solar light which passes through the photovoltaic element, thereby improving efficiency of power generation. The higher the light reflectance, the better.

The light reflectance refers to a ratio of the total amount of light reflected by the first polymer layer or the first polymer layer and the support to the total amount of light incident on the backsheet surface which includes the first polymer layer.

To improve the light reflectance at 550 nm of the surface including the first polymer layer, the first polymer layer preferably includes the white pigment in an amount of from 30% by mass to 90% by mass based on the total mass of the polymer and the white pigment in the first polymer layer.

The first polymer layer may or may not further include various components such as a surfactant and a filler, as required. In place of the white pigment described above, the first polymer layer may or may not include a color pigment.

Examples of the surfactant include known anionic and nonionic surfactants. In a case in which the surfactant is added, the surfactant is preferably added in an amount of from 0.1 mg/m$^2$ to 15 mg/m$^2$ and more preferably from 0.5 mg/m$^2$ to 5 mg/m$^2$. When the addition amount of the surfactant is 0.1 mg/m$^2$ or more occurence of cissing may be suppressed and thus the first polymer layer may be successfully formed. Addition of the surfactant in an amount of 15 mg/m$^2$ or less may allow good adhesion.

In addition to the white pigment as described above, a filler such as silica may or may not be added. In a case in which the filler is added, the filler is preferably added in an amount of 20% by mass or less, and more preferably 15% by mass or less, based on the total mass of the polymer in the first polymer layer. Addition of the filler in an amount of 20% by mass or less may further increase the reflectance and may further improve the adhesion between the support and the first polymer layer.

Examples of the color pigment include ultramarine blue and carbon black. In a case in which the first polymer layer includes the color pigment such as ultramarine blue or carbon black in place of the white pigment described above, the first polymer layer can provide improved appearance and design to a solar cell, although the polymer layer is less likely to have reflectivity. The first polymer layer may include the color pigment in an amount of from 30% by mass to 90% by mass based on the total mass of the polymer and the color pigment in the first polymer layer.

—Method for Forming First Polymer Layer—

The first polymer layer is formed by coating, on one surface of the support, a coating liquid for forming the first polymer layer, the coating liquid including the polymer described above and the other optional ingredients which may be included as required in an amount to provide the amount of the polymer and the other ingredients as specified above. In a case in which the first polymer layer is provided with a function as a reflection layer, the white pigment may be further added to the coating liquid for forming the first polymer layer.

Examples of a coating method include known coating processes such as gravure coating and bar coating.

The coating liquid may be an aqueous one that includes water as the solvent or may be a solvent-based one that includes an organic solvent such as toluene or methylethylketone. Especially, the coating preferably includes water as the solvent in terms of environmental burden. The coating solvent may be used alone, or two or more of the solvents may be used in combination. Examples of the preferable coating solvent include water and a mixture of water and methyl alcohol with a ratio of water/methyl alcohol of 95/5 (mass ratio).

The first polymer layer of the backsheet has a thickness of 0.5 μm to 12.0 μm.

In a case in which the first polymer layer has a thickness of 12.0 μm or less, the first polymer layer may be less likely to heat-shrink even in a hot-pressing process of the backsheet and under exposure to heat damp environment for a long term. In a case in which the first polymer layer has a thickness of 0.5 μm or more, the first polymer layer may have an improved adhesion to an encapsulant (for example, 10 N/cm or more). In one embodiment, the first polymer layer preferably has a thickness of 1 μm to 10 μm.

The first polymer layer may be a monolayer, which consists of a single layer, or a multilayer, which consists of two or more layers. In a case in which the first polymer layer is a multilayer, it is sufficient as long as the layer closest to the support has a thickness of 0.5 μm to 12.0 μm, while the multilayered first polymer layer preferably has a total thickness of 0.5 μm to 12.0 μm, and more preferably from 1 μm to 10 μm, in view of suppressing thermal shrinkage of the first polymer layer.

When the coating liquid for forming the first polymer layer is applied to the support, the coating liquid for forming the first polymer layer can be applied directly or via a primer layer having a thickness of 2 μm or less to the surface of the support to be provided with the first polymer layer.

(Primer Layer)

The backsheet may or may not include the primer layer between the support and the first polymer layer. In a case in which the primer layer is included, the primer layer preferably has a thickness of 2 μm or less, more preferably from 0.05 μm to 2 μm, and still more preferably from 0.1 μm to 1.5 μm. In a case in which the primer layer has a thickness of 2 μm or less, the backsheet can have a good surface condition. In a case in which the primer layer has a thickness of 0.05 μm or more, the backsheet is more likely to ensure required adhesion.

The surface of the support provided with the first polymer layer is also referred to as a "top surface", while the primer layer disposed between the support and the first polymer layer is also referred to as an "upper primer layer".

The primer layer can include a binder. Examples of the binder which can be used include a polyester, an urethane resin, an acrylic resin, and an olefin resin. In addition to the binder, a crosslinking agent such as an epoxy crosslinking agent, an isocyanate crosslinking agent, a melamine crosslinking agent, a carbodiimide crosslinking agent, or an oxazolin crosslinking agent, a surfactant such as an anionic surfactant or a nonionic surfactant, a filler such as silica, and the like may or may not be added to the primer layer.

A process for coating the coating liquid for forming the primer layer and a solvent for the coating liquid are not particularly limited.

Examples of the coating process which can be used include gravure coating and bar coating.

The solvent for the coating may be water or an organic solvent such as toluene or methylethylketone. The solvent may be used alone, or two or more of the solvents may be used in combination.

In a case in which the support is a biaxially stretched film, the coating liquid may be applied to the biaxially stretched support. Alternatively, the coating liquid may be applied to a uniaxially stretched support and then the resultant support may be stretched in a direction different from the direction in the uniaxial stretching process. The coating may also be applied to the support before stretching, and then the resultant support may be biaxially stretched.

[Second Polymer Layer]

The backsheet includes the second polymer layer which is formed on another surface of the support by coating, which includes a fluorinated resin or a silicone-based resin, and which has a thickness of 0.2 μm to 15.0 μm.

Inclusion of at least one of the fluorinated resin or the silicone resin as a binder in the second polymer layer may allow the backsheet to have high weatherability.

(Fluorinated Resin)

Examples of the fluorinated resin include a polymer which has a repeat unit represented by —$(CFX^1—CX^2X^3)$—. In the repeat unit, $X^1$, $X^2$, and $X^3$ independently represent a hydrogen atom, a fluorine atom, a chlorine atom, or a perfluoroalkyl group having a carbon number of from 1 to 3.

Examples of the fluorinated resin include polytetrafluoroethylene, polyvinyl fluoride, polyvinylidene fluoride, polychlorotrifluoroethylene, and polytetrafluoropropylene.

These polymers may be a homopolymer, which is formed by polymerizing identical monomers, or a copolymer, which is formed by copolymerizing two or more kinds of monomers. A copolymer formed by copolymerizing these monomers with another monomer may be also used.

Examples of these polymers include a copolymer of tetrafluoroethylene and tetrafluoropropylene, a copolymer of tetrafluoroethylene and vinylidene fluoride, a copolymer of tetrafluoroethylene and ethylene, a copolymer of tetrafluoroethylene and propylene, a copolymer of tetrafluoroethylene and vinyl ether, a copolymer of tetrafluoroethylene and perfluoro vinyl ether, a copolymer of chlorotrifluoroethylene and vinyl ether, and a copolymer of chlorotrifluoro ethylene and perfluoro vinyl ether.

(Silicone-Based Resin)

A silicone-based resin is a polymer with a siloxane backbone in a main or a side chain thereof.

Examples of the silicone-based resin include: a silicone resin; a modified silicone resin; and a composite polymer in which a polymer having a siloxane backbone and another polymer (for example, an acrylic resin) are copolymerized. Among them, a composite polymer of a silicone resin and an acrylic resin is preferable.

Examples of the silicone-based resin can include CERANATE WSA-1060 and CERANATE WSA-1070 (both trade names; manufactured by DIC Corp.) and POLYDUREX H-7620, POLYDUREX H-7630, and POLYDUREX H-7650 (all trade names; manufactured by Asahi Kasei Chemicals Corp.).

Among them, a silicone resin is more preferable to improve resistance to temperature and humidity changes and severe damp heat environment.

The second polymer layer preferably includes the fluorinated resin or the silicone-based resin in an amount of from 15% by mass to 90% by mass, and more preferably 60% by mass to 90% by mass, based on the total mass of the second polymer layer. In a case in which the second polymer layer includes the fluorinated resin or the silicone-based resin in an amount of 15% by mass or more, the backsheet may have adequate durability. In a case in which the second polymer layer includes the fluorinated resin or the silicone-based resin in an amount of 90% by mass or less, a sufficient amount of the crosslinking agent and the surfactant can be added, which is advantageous in terms of film strength and coated surface conditions.

(Various Ingredients)

The second polymer layer may or may not include, as required, various ingredients such as the surfactant and the filler which can be included in the first polymer layer as described above, provided that such ingredients do not detract from the effects. In this case, the second polymer layer preferably includes the surfactant in an amount of from $0.1$ mg/m$^2$ to $15$ mg/m$^2$ and more preferably from $0.5$ mg/m$^2$ to $5$ mg/m$^2$. The second polymer layer preferably includes the filler in an amount of 20% by mass or less, and more preferably 15% by mass or less, based on the total mass of the fluorinated resin or the silicone-based resin in the second polymer layer.

—Method for Forming Second Polymer Layer—

The second polymer layer is formed by coating, on a surface on an opposite side from the support on which the first polymer layer is to be provided, a coating liquid for forming the second polymer layer, the coating liquid including the fluorinated resin or the silicone-based resin described above and the other optional ingredients in an amount to provide the amount of the resin and the other ingredients as specified above.

Examples of a coating process which can be used include known processes such as gravure coating and bar coating.

The coating liquid may be an aqueous coating liquid which includes water as a solvent or a solvent solution which includes an organic solvent such as toluene or methylethylketone. Especially, the coating preferably includes water as the solvent in terms of environmental burden. The coating solvent may be used alone, or two or more of the solvents may be used in combination. Examples of the preferable coating solvents include water and a mixture of water and methyl alcohol with a ratio of water/methyl alcohol of 95/5 (mass ratio).

The second polymer layer of the backsheet has a thickness of 0.2 μm to 15.0 μm.

Since the second polymer layer has a thickness of 15.0 μm or less, the first polymer layer may be less likely to heat-shrink even in a hot-pressing process of the backsheet and under exposure to heat damp environment for a long term. Since the second polymer layer has a thickness of 0.2 μm or more, the layer may have weatherability. In one embodiment, the second polymer layer preferably has a thickness of 0.5 μm to 12 μm.

The second polymer layer may be a monolayer, which consists of a single layer, or a multilayer, which consists of two or more layers. In a case in which the second polymer layer is a multilayer, it is sufficient as long as the layer closest to the support has a thickness of 0.2 μm to 15.0 μm, while the multilayered second polymer layer preferably has a total thickness of 0.2 µm to 15.0 µm, and more preferably from 0.5 µm to 12 µm, to inhibit thermal shrinkage of the second polymer layer.

When the coating liquid for forming the second polymer layer is applied to the support, the coating liquid for forming the second polymer layer can be applied directly or via a primer layer having a thickness of 2 µm or less to the surface of the support to be provided with the second polymer layer (the opposite surface from the surface of the support to be provided with the first polymer layer).

The primer layer which may be disposed between the second polymer layer and the support can be formed, by coating, in the similar configuration to the configuration of the primer layer which may be disposed between the first polymer layer and the support.

The backsheet is formed by at least coating the coating liquid for forming the first polymer layer and the coating liquid for forming the second polymer layer onto the support. In one embodiment, the backsheet is formed by forming all of layers which constitute the backsheet except for the support by coating.

<Solar Cell Modules>

The solar cell module of the present disclosure includes the backsheet described above.

In one embodiment, the module includes a photovoltaic element, an encapsulant which encapsulates the photovoltaic element, a top surface protection member which is adhered to the encapsulant and which protects a light-receiving side, and a back surface protection member which is adhered to the encapsulant and which protects the opposite side from the light-receiving side, the back surface protection member being the backsheet described above. More specifically, for example, the photovoltaic element which converts solar light energy into electrical energy is disposed between a transparent substrate (the top surface protection member) which receives solar light and the backsheet described above (the back surface protection member, and the encapsulant, preferably ethylene-vinyl acetate (EVA) encapsulant, is used to encapsulate a space between the substrate and the backsheet.

The solar cell module, the photovoltaic element (cell), and the components other than the backsheet are detailed in, for example, "Taiyoh-ko Hatsuden Shistem Kohsei Zairyo" edited by Eiich Sugimoto(Kogyo Chosakai Publishing Co., Ltd., 2008).

The transparent substrate may be any substrate as long as the substrate can transmit solar light, and can be appropriately selected from any supports which can transmit light. The higher the light transmission of the substrate, the more preferable in terms of efficiency of power generation. Examples of such substrate which can be suitably used include glass substrates and transparent resins such as acrylic resin.

Examples of the photovoltaic element which can be used include a variety of known photovoltaic elements including those based on silicons such as monocrystalline silicon, multicrystalline silicon, and amorphous silicon, and semiconductors based on Group III-V or II-VI compound such as copper-indium-gallium-selenium, copper-indium-selenium, cadmium-tellurium, and gallium-arsenic.

EXAMPLES

The present invention will be more specifically described with reference to Examples hereinafter, although the present invention is not intended to be limited thereto as long as the spirit of the present invention is not departed. Unless otherwise specified, "part" and "%" are based on mass. Unless otherwise specified, average volume particle sizes are measured by LA-950 LASER DIFFRACTION PARTICLE SIZE DISTRIBUTION ANALYZER (trade name, manufactured by Horiba, Ltd.).

<Production of Support 1 (Polyester Support)>

—Synthesis of Polyester—

A slurry formed of 100 kg of high purity terephthalic acid (manufactured by Mitsui Chemicals, Inc.) and 45 kg of ethylene glycol (manufactured by Nippon Shokubai Co., Ltd.) was sequentially fed, over a period of 4 hours, into an esterification reactor, in which about 123 kg of bis(hydroxyethyl) terephthalate was introduced in advance and which was kept at a temperature of 250° C. and a pressure of $1.2 \times 10^5$ Pa. After the feeding was completed, the esterification reaction was continued for an hour. Then 123 kg of the resulting esterification product was transferred to a polycondensation reactor.

To the polycondensation reactor to which the esterification product was transferred, ethylene glycol was added in an amount of 0.3% based on the polymer to be produced. After stirring for 5 minutes, an ethylene glycol solution of cobalt acetate and an ethylene glycol solution of manganese acetate were added so as to be 30 ppm and 15 ppm respectively based on the polymer to be produced. After stirring for 5 minutes, a 2% solution of a titanium alkoxide compound in ethylene glycol was added in an amount of 5 ppm based on the polymer to be produced.

After 5 minutes of the addition, a 10% solution of ethyl diethylphosphonoacetate in ethylene glycol was added so as to be 5 ppm based on the polymer to be produced. The resultant low polymer and the reaction system were gradually heated from 250° C. to 285° C. with stirring at 30 rpm, while the pressure was reduced to 40 Pa. A time to reach the final temperature and the final pressure was set to 60 minutes. When the stirring torque reached the predetermined value, the reaction system was purged with nitrogen and returned to atmospheric pressure to halt the polycondensation reaction. Then the resultant was extruded into cold water to be in a strand shape. Immediately thereafter, the strands were chopped into polymer pellets having a diameter of about 3 mm and a length of about 7 mm The time from beginning the depressurizing until the torque reached the predetermined value was 3 hours.

The titanium alkoxide compound is the compound which is synthesized as described in Example 1 in the paragraph [0083] of JP-A No. 2005-340616 and has a Ti content of 4.44%.

—Solid Phase Polymerization—

The pellets obtained as described above were placed in a vacuum chamber held at 40 Pa at a temperature of 220° C. for 30 hours to perform solid phase polymerization.

—Formation of Base—

The solid phase polymerized pellets were melted at 280° C. and cast on a metal drum to form an unstretched base having a thickness of about 2.5 mm The unstretched base was stretched three times in the longitudinal direction at 90° C. (longitudinal stretching) and then stretched 3.3 times in the transverse direction at 120° C. (transverse stretching). The transversely stretched base was held at 215° C. for one minute while applying a transversely stretching tension to heat-set the base, thereby giving a support 1, which is a biaxially stretched polyethylene terephthalate (hereinafter referred to as "biaxially stretched PET") having a thickness of 250 µm.

<Production of Supports 2 to 4>

A support 2, which is a biaxially stretched PET having a thickness of 125 µm, a support 3, which is a biaxially stretched PET having a thickness of 188 µm, and a support 4, which is a biaxially stretched PET having a thickness of 300 µm, were obtained in the similar manner as the above process, except that the thicknesses of the unstretched bases therefor were varied.

Example 1

<Formation of Layers>
—Preparation of Coating Liquid for Forming Primer Layer—
The ingredients described in "Ingredients of Coating liquid for Forming Primer Layer" below were mixed to prepare the coating liquid for forming the primer layer.
(Ingredients of Coating liquid for Forming Primer Layer)

| | |
|---|---|
| Polyester (binder) [Trade name: VYLONAL MD-1245, manufactured by Toyobo Co., Ltd., solid content: 30%] | 48.0 parts |
| Carbodiimide compound (crosslinking agent) [Trade name: CARBODILITE V-02-L2, manufactured by Nisshinbo Chemical Inc., solid content: 10%] | 10.0 parts |
| Oxazoline compound (crosslinking agent) [EPOCROS ® WS-700, manufactured by Nippon Shokubai Co., Ltd., solid content: 25%] | 3.0 parts |
| Surfactant [Trade name: NAROACTY CL-95, manufactured by Sanyo Chemical Industries, Ltd., solid content: 1%] | 15.0 parts |
| Distilled water | 907.0 parts |

(Formation of Primer Layer)
The resultant coating liquid for forming the primer layer was applied to one surface of the support 1 in an amount to provide 0.1 g/m² of the binder and then dried at 180° C. for one minute to form a primer layer (upper primer layer) having a dry thickness of 0.1 μm.

<Formation of First Polymer Layer>
—Preparation of Titanium Dioxide Dispersion 1—
The ingredients described in "Ingredients of Titanium Dioxide Dispersion 1" below were mixed, and the mixture was dispersed in a Dynomill bead mill for one hour.
(Ingredients of Titanium Dioxide Dispersion 1)

| | |
|---|---|
| Titanium dioxide (white pigment) having an average volume particle size of 0.42 μm [Trade name: TIPAQUE R-780-2, manufactured by Ishihara Sangyo Kaisha, Ltd., a solid content: 100%] | 39.9% |
| Polyvinyl alcohol [Trade name: PVA-105, manufactured by Kuraray Co., Ltd., a solid content: 10%] | 16.0% |
| Surfactant [Trade name: DEMOL EP, manufactured by Kao Corp., a solid content: 25%] | 0.5% |
| Distilled water | 51.6% |

—Preparation of Coating liquid for Forming First Polymer Layer—
The ingredients described in "Ingredients of Coating liquid for Forming First Polymer Layer" below were mixed to prepare the coating liquid for forming the first polymer layer.
(Ingredients of Coating liquid for Forming First Polymer Layer)

| | |
|---|---|
| Titanium dioxide dispersion 1 (white pigment dispersion) | 80.0% |
| Silanol-modified polyvinyl alcohol (polymer) [Trade name: PVA R-1130, manufactured by Kuraray Co., Ltd., a solid content: 7%] | 19.2% |
| Polyoxyalkylene alkylether (surfactant) [Trade name: NAROACTY CL-95, manufactured by Sanyo Chemical Industries, Ltd., a solid content: 1%] | 3.0% |
| Oxazoline compound (crosslinking agent) [EPOCROS ® WS-700, manufactured by Nippon Shokubai Co., Ltd., a solid content: 25%] | 2.0% |
| Distilled water | 7.8% |

—Formation of First Polymer Layer—
The resultant coating liquid for forming the first polymer layer was applied to the side of the biaxially stretched PET support 1 on which the upper primer layer was provided, and then dried at 180° C. for a minute to form the first polymer layer which had a white pigment (titanium dioxide) content of 7.0 g/m² and a thickness of 3.5 μm.

<Formation of Second Polymer Layer>
(Back Layer of Second Polymer Layer (Layer Adjacent to Support))
—Preparation of Titanium Dioxide Dispersion 2—
The ingredients described in "Ingredients of Titanium Dioxide Dispersion 2" below were mixed, and the mixture was dispersed in a Dynomill bead mill for an hour.
(Ingredients of Titanium Dioxide Dispersion 2)

| | |
|---|---|
| Titanium dioxide (white pigment) having an average volume particle size of 0.42 μm [Trade name: TIPAQUE R-780-2, a solid content: 100%, manufactured by Ishihara Sangyo Kaisha, Ltd.] | 40% |
| Aqueous polyvinyl alcohol solution [Trade name: PVA-105, a solid content: 10%, manufactured by Kuraray Co., Ltd.] | 8.0% |
| Surfactant [Trade name: DEMOL EP, a solid content: 25%, manufactured by Kao Corp.] | 0.5% |
| Distilled water | 51.5% |

—Preparation of Coating for Forming Back Layer of Second Polymer Layer—The ingredients described in "Ingredients of Coating liquid for Forming Back Layer of Second Polymer Layer" below were mixed to prepare the coating liquid for forming the back layer of the second polymer layer.
(Ingredients of Coating Liquid for Forming Back Layer of Second Polymer Layer)

| | |
|---|---|
| Acrylic-silicone binder (silicone-based resin, P-1) [Trade name: CERANATE WSA-1070, manufactured by DIC Corp., a solid content: 40%] | 362.3 parts |
| Carbodiimide compound (crosslinking agent, A-1) [Trade name: CARBODILITE V-02-L2, manufactured by Nisshinbo Chemical Inc., a solid content: 40%] | 48.3 parts |
| Surfactant [Trade name: NAROACTY CL-95, manufactured by Sanyo Chemical Industries, Ltd., a solid content: 1%] | 9.7 parts |
| Titanium Dioxide Dispersion 2 described above | 157.0 parts |
| Distilled water | 422.7 parts |

—Formation of Back Layer of Second Polymer Layer—
The resultant coating liquid for forming the back layer of the second polymer layer was applied, in an amount to provide 3.0 g/m² of the silicone-based resin (P-1), to an opposite surface from the surface of the support 1 on which the first polymer layer was provided, and then dried at 180° C. for one minute to form the back layer of the second polymer layer having a dry thickness of 3 μm.

(Upper Layer of Second Polymer Layer)
—Preparation of Coating Liquid for Forming Upper Layer of Second Polymer Layer—
The ingredients described in "Ingredients of Coating liquid for Forming Upper layer of Second Polymer Layer" below were mixed to prepare the coating liquid for forming the back side polymer layer.
(Ingredients of Coating Liquid for Forming Upper Layer of Second Polymer Layer)

| | |
|---|---|
| Acrylic-silicone binder (silicone-based resin, P-1) [Trade name: CERANATE WSA-1070, manufactured by DIC Corp., a solid content: 40%] | 362.3 parts |

| | |
|---|---|
| Carbodiimide compound (crosslinking agent, A-1) [Trade name: CARBODILITE V-02-L2, manufactured by Nisshinbo Chemical Inc., a solid content: 40%] | 24.2 parts |
| Surfactant [Trade name: NAROACTY CL-95, manufactured by Sanyo Chemical Industries, Ltd., a solid content: 1%] | 24.2 parts |
| Distilled water | 703.8 parts |

—Formation of Upper Layer of Second Polymer Layer—

The resultant coating for forming the upper layer of the second polymer layer is applied onto the back layer of the second polymer layer in an amount to provide 2.0 g/m$^2$ of the silicone-based resin (P-1) and then dried at 180° C. for one minute to form the upper layer of the second polymer layer having a dry thickness of 2.5 μm.

As described above, the first polymer layer and the second polymer layer were formed by the coating process to the respective side of the support 1 to produce the backsheet 1 including the polymer layers.

The resultant backsheet 1 was evaluated as described below. The results are shown in Table 1.

<Evaluation>

—1. Reflectance—

A spectrophotometer (trade name: UV-2450, manufactured by Shimadzu Corp.) equipped with an integrating sphere attachment (trade name: ISR-2200, manufactured by Shimadzu Corp.) was used to measure reflectance of light at 550 nm of the surface of the backsheet 1, which is among surfaces of the backsheet 1 and on which the first polymer layer is provided. As a reference, a reflectance of a barium sulfate standard plate was measured, and the reference value was regarded as 100% for calculating the reflectance (%) of the backsheet 1.

—2. Adhesion—

[A] Adhesion Before Damp Heat Aging (Fr)

The backsheet 1 was cut to prepare two sample pieces having a width of 20 mm and a length of 150 mm The two sample pieces were placed so that the first polymer layers thereof were disposed, and an EVA sheet which had a width of 20 mm and a length of 100 mm (trade name: SC 50-B, manufactured by Mitsui Chemicals Fabro, Inc.) was interposed between the sample pieces. Because the length of the sample pieces was different from that of the EVA sheet, the resultant layered sample did not include the EVA sheet in the area ranging from a terminus of the sample to a portion which is 50 mm-apart from the terminus The layered sample was hot-pressed in a vacuum laminator (manufactured by Nisshinbo Mechatronics Inc.) to bond the EVA sheet with the first polymer layers of the sample pieces. The bonding conditions are described below.

After vacuuming at 128° C. for 3 minutes in the vacuum laminator, pressure was applied for 2 minutes to temporarily bond the layers. Then the layers were fully bonded in a dry oven at 150° C. for 30 minutes. The resultant sample for evaluating adhesion, which had the two sample pieces which were bonded to one another and between which the EVA sheet was disposed in the area except for the area ranging from a terminus of the sample to a portion which is 50 mm-apart from the terminus, was thus obtained.

The area with no EVA sheet in the resultant sample for evaluating adhesion was clamped in jaws of a universal testing machine (trade name: TENSILON RTC-1210A, manufactured by Orientec Co., Ltd.) and was subjected to tensile shear testing at a separation angle of 180° and a tensile speed of 300 mm/min The measured tensile shear bond strength was used as an indicator of the adhesion.

The adhesion was evaluated in accordance with the following criteria. The grade 3 or higher indicate as being in a practically acceptable range. The grade 4 is preferable, and the grade 5 is more preferable.

<Evaluation Criteria>

5: Very good adhesion (60 N/20 mm or more)

4: Good adhesion (at least 30 N /20 mm and less than 60N/20 mm)

3: Poor adhesion (at least 20 N/20 mm and less than 30 N/20 mm)

2: Adhesive failure (at least 10 N/20 mm and less than 20 N/20 mm)

1: Severe adhesive failure (less than 10 N/20 mm)

[B] Adhesion After Damp Heat Aging (PC)

After keeping the resultant sample for evaluating adhesion at 120° C. and 100% RH for 48 hours (damp heat aging), the adhesion of the sample was measured in the same manner as the manner described in [A].

The measurement was evaluated in the same manner as the manner described in [A] Adhesion Before Damp Heat Aging.

—3. Warpage—

A reinforced glass sheet having a width of 300 mm, a length of 600 mm, and a thickness of 3.2 mm, a cut EVA sheet having a width of 300 mm and a length of 600 mm (trade name: SC 50B, manufactured by Mitsui Chemicals Fabro, Inc.), and the cut backsheet 1 having a width of 300 mm and a length of 600 mm were stacked in this order, and the reinforced glass sheet, the EVA sheet, and the backsheet 1 in the resulting laminate 1 were bonded together by hot pressing in a vacuum laminator from Nisshinbo Mechatronics Inc. The following bonding conditions were used.

A vacuum was drawn at 128° C. for 3 minutes with the vacuum laminator, and pressure was applied for 2 minutes to temporarily bond the layers in the laminate 1. Then the bonded layers were fully bonded in a dry oven at 150° C. for 30 minutes.

Note that the backsheet 1 was disposed to contact the first polymer layer with the EVA sheet.

The thus-obtained laminate 1, which consists of the reinforced glass layer, the EVA layer, and the backsheet 1, was held at 25° C/60% RH for 24 hours.

Under the temperature and the humidity conditions, the distance from a straight line across the surface of the backsheet 1 to the center of the surface of the backsheet 1 was measured. The resultant value was recorded as N1. A positive N1 value indicates that the laminate 1 is curved toward the inside of the backsheet 1.

The distance from another straight line across the surface of the rectangular sample to the center of the surface of the sample was measured, and the resultant value was recorded as N2. The average of the two measurements (N1 and N2) was recorded as the "warpage" of the sample.

The determined warpage was evaluated in accordance with the following criteria. The grade 3 or higher indicate as being in a practically acceptable range, and the grade 4 is preferable.

—Evaluation Criteria—

4: Very good warpage resistance (less than 0 5 mm)

3: Good warpage resistance (at least 0.5 mm and less than 1 0 mm)

2: Poor warpage resistance (at least 1.0 mm and less than 2 0 mm)

1: Very poor warpage resistance (2 0 mm or more)

—4. Surface Conditions after Damp Heat Aging —

The laminate 1 consisting of the reinforced glass, the EVA sheet, and backsheet 1, the laminate being produced in the same manner as for the warpage evaluation, was subject to damp heat treatment at 120° C. and 100% RH for 50 hours, and then the appearance was visually observed.

If the first polymer layer or the second polymer layer (at least one of the upper layer and the back layer) does not separate from the EVA sheet and/or the support, it is practically acceptable.

—5. Retention of Elongation at Break—

The retention of elongation at break (%) of the support (support 1) of the backsheet 1 was calculated using the following equality, based on the elongation at break values $L^0$ and $L^1$ measured in accordance with the following method. 50% or more of retention of elongation at break indicates a practically acceptable level.

Retention of Elongation at Break (%)=$(L^1/L^0) \times 100$ (Method for Measuring Elongation at Break)

The support (support 1) was cut into pieces having a width of 10 mm and a length of 200 mm to prepare sample pieces A and B for the measurement.

The sample piece A was conditioned at 25° C. and 60% RH for 24 hours and then subjected to tensile testing using a universal testing machine (trade name: TENSILON RTC-1210A, manufactured by Orientec Co., Ltd.). The test was performed by clamping the sample at either end area ranging from a terminus of the sample to a portion which is 50 mm-inside apart from the terminus, so as to set a length of an area to be extended to 100 mm The tensile speed was 20 mm/min The resultant elongation at break of the sample piece A was recorded as $L^0$.

The sample piece B was subjected to damp heat treatment at 120° C. and 100% RH for 50 hours, and then subjected to tensile testing in the same manner as the manner for the sample piece A. The resultant elongation at break of the sample piece B was recorded as O.

Examples 2 and 3

The backsheet 2 in Example 2 and the backsheet 3 in Example 3 were produced in the same manner as the manner for the backsheet 1 in Example 1 except that the white pigment (titanium dioxide) used for the first polymer layer of the support 1 was changed to ultramarine blue, which is a color pigment, (Example 2) or carbon black, which is also a color pigment (Example 3).

A ultramarine blue dispersion and a carbon black dispersion were produced as described below.

(Preparation of Ultramarine Blue Dispersion)

The ingredients described in "Ingredients of Ultramarine Blue Dispersion" below were mixed, and the mixture was dispersed in a Dynomill bead mill for an hour.

(Ingredients of Ultramarine Blue Dispersion)

| | |
|---|---|
| Ultramarine blue [Trade name: ULTRAMARINE BLUE NUBIFLOW available from Ozeki Co., Ltd.] | 39.9% |
| Polyvinyl alcohol [Trade name: PVA-105, solid content: 10%, manufactured by Kuraray Co., Ltd.] | 8.0% |
| Surfactant name: DEMOL EP, solid content: 25%, manufactured by Kao Corp.] | 0.5% |
| Distilled water | 51.6% |

(Preparation of Carbon Black Dispersion)

The ingredients described in "Ingredients of Carbon Black Dispersion" below were mixed, and the mixture was dispersed in a Dynomill bead mill for an hour.

(Ingredients of Carbon Black Dispersion)

| | |
|---|---|
| Carbon black (CB) [Trade name: TOKABLACK #8500F manufactured by Tokai Carbon Co., Ltd.] | 39.9% |
| Polyvinyl alcohol [Trade name: PVA-105, solid content: 10%, manufactured by Kuraray Co., Ltd.] | 8.0% |
| Surfactant [Trade name: DEMOL EP, solid content: 25%, manufactured by Kao Corp.] | 0.5% |
| Distilled water | 51.6% |

The resultant backsheet 2 and backsheet 3 were evaluated in the same manner as the manner for the backsheet 1 in Example 1 except for the evaluation described in "1. Reflectance". The results are shown in Table 1.

Examples 4 to 6

The backsheets 4 to 6 in Examples 4 to 6 were produced in the same manner as the manner for the backsheets 1 to 3 in Examples 1 to 3 except that the silicone-based resin (P-1, acrylic-silicone binder (trade name: CERANATE WSA-1070, manufactured by DIC Corp.)) for the upper layer of the second polymer layer was changed to a fluorinated resin [P-2, trade name: OBBLIGATO SSW-0011F, manufacture by AGC Coat-Tech Co., Ltd.; a solid content: 39%].

The resultant backsheets 4 to 6 were evaluated in the same manner as the manner for the backsheet 1 in Example 1, except that the backsheets in Example 5 and Example 6, which include ultramarine blue or carbon black as the pigment, were not evaluated for reflectance. The results are shown in Table 1.

Comparative Example 1

The backsheet 101 in Comparative Example 1 was produced in the same manner as the manner for the backsheet 1 in Example 1 except that the back layer and the upper layer of the second polymer layer were not formed on the support by the coating process, and, instead, vinyl fluoride sheets (material sheets) having a thickness of 40 μm were stuck together under the condition described below.

<Sticking Process>

An adhesive prepared by mixing LX-660 (K) (trade name, manufactured by DIC Corp.) with 10 parts of a curing agent (trade name, manufactured by KW-75 by DIC Corp.) was used to bond the two vinyl fluoride sheets having a thickness of 40 μm by hot pressing with a vacuum laminator manufactured by Nisshinbo Mechatronics Inc.

A vacuum was drawn at 80° C. for 3 minutes, and pressure was applied for 2 minutes to bond the sheets. The bonded sheets were then held at 40° C. for 4 days to complete the reaction.

The resultant backsheet 101 was evaluated in the same manner as the manner for the backsheet 1 in Example 1. In the evaluation as described in "4. Surface Conditions after Damp Heat Aging", if the part stuck by the adhesive did not separate, the sheet was evaluated as practically acceptable.

The results are shown in Table 1.

Comparative Example 2

The backsheet 102 in Comparative Example 2 was produced in the same manner as the manner for the backsheet 1 in Example 1 except that the upper primer layer and the first polymer layer were not formed on the support 1 by the coating process.

The resultant backsheet 102 was evaluated in the same manner as the manner for the backsheet 1 in Example 1 except for the evaluation described in "1. Reflectance". The results are shown in Table 1.

Examples 7 to 9

The backsheets 7 to 9 in Examples 7 to 9 were produced in the same manner as the manner for the backsheet 1 in Example 1 except that the supports 2 to 4, which had a thickness different from the thickness of the support 1, were used.

The resultant backsheets 7 to 9 were evaluated in the same manner as the manner for the backsheet 1 in Example 1. The results are shown in Table 1.

Examples 10 to 14, and Comparative Examples 3 to 8

The backsheets 10 to 14 in Examples 10 to 14, and the backsheets 103 to 108 in Comparative Examples 3 to 8 were produced in the same manner as the manner for the backsheet 1 in Example 1 except that the thicknesses of the first polymer layer and the upper layer and the back layers of the second polymer layer were respectively changed to the thicknesses shown in Table 1.

The resultant backsheets 10 to 14 and the backsheets 103 to 108 were evaluated in the same manner as the manner for the backsheet 1 in Example 1. The results are shown in Table 1.

TABLE 1

| | Support | First Polymer Layer | | | | Second Polymer Layer | | | Polymer Layer 3 |
| | | Polymer Layer 1 | | | | Polymer Layer 2 [Back Layer] | | | |
| | Thickness [μm] | Type | Pigment Type | Formation Method | Thickness [μm] | Binder | Formation Method | Thickness [μm] | [Top Layer] Binder |
| --- | --- | --- | --- | --- | --- | --- | --- | --- | --- |
| Example 1 | 250 | White/Readily Adherable Layer | TiO$_2$ | Coating | 3.5 | Silicone-based | Coating | 3.0 | Silicone-based |
| Example 2 | 250 | Blue/Readily Adherable Layer | Ultramarine Blue | Coating | 3.5 | Silicone-based | Coating | 3.0 | Silicone-based |
| Example 3 | 250 | Black/Readily Adherable Layer | CB | Coating | 3.5 | Silicone-based | Coating | 3.0 | Silicone-based |
| Example 4 | 250 | White/Readily Adherable Layer | TiO$_2$ | Coating | 3.5 | Silicone-based | Coating | 3.0 | Fluorinated |
| Example 5 | 250 | Blue/Readily Adherable Layer | Ultramarine Blue | Coating | 3.5 | Silicone-based | Coating | 3.0 | Fluorinated |
| Example 6 | 250 | Black/Readily Adherable Layer | CB | Coating | 3.5 | Silicone-based | Coating | 3.0 | Fluorinated |
| Comparative Example 1 | 250 | White/Readily Adherable Layer | TiO$_2$ | Coating | 3.5 | Fluorinated | Sheet Bonding | 40 | None |
| Comparative Example 2 | 250 | | None | | | Silicone-based | Coating | 3.0 | Silicone-based |
| Example 7 | 125 | White/Readily Adherable Layer | TiO$_2$ | Coating | 3.5 | Silicone-based | Coating | 3.0 | Silicone-based |
| Example 8 | 188 | White/Readily Adherable Layer | TiO$_2$ | Coating | 3.5 | Silicone-based | Coating | 3.0 | Silicone-based |
| Example 9 | 300 | White/Readily Adherable Layer | TiO$_2$ | Coating | 3.5 | Silicone-based | Coating | 3.0 | Silicone-based |
| Comparative Example 3 | 250 | White/Readily Adherable Layer | TiO$_2$ | Coating | 0.15 | Silicone-based | Coating | 3.0 | Silicone-based |
| Example 10 | 250 | White/Readily Adherable Layer | TiO$_2$ | Coating | 1.0 | Silicone-based | Coating | 3.0 | Silicone-based |
| Example 11 | 250 | White/Readily Adherable Layer | TiO$_2$ | Coating | 3.5 | Silicone-based | Coating | 3.0 | Silicone-based |
| Example 12 | 250 | White/Readily Adherable Layer | TiO$_2$ | Coating | 8.0 | Silicone-based | Coating | 3.0 | Silicone-based |
| Comparative Example 4 | 250 | White/Readily Adherable Layer | TiO$_2$ | Coating | 14 | Silicone-based | Coating | 3.0 | Silicone-based |
| Comparative Example 5 | 250 | White/Readily Adherable Layer | TiO$_2$ | Coating | 18 | Silicone-based | Coating | 3.0 | Silicone-based |
| Comparative Example 6 | 250 | White/Readily Adherable Layer | TiO$_2$ | Coating | 3.5 | Silicone-based | Coating | 0.1 | Silicone-based |
| Example 13 | 250 | White/Readily Adherable Layer | TiO$_2$ | Coating | 3.5 | Silicone-based | Coating | 3.0 | Silicone-based |
| Example 14 | 250 | White/Readily Adherable Layer | TiO$_2$ | Coating | 3.5 | Silicone-based | Coating | 8.0 | Silicone-based |
| Comparative Example 7 | 250 | White/Readily Adherable Layer | TiO$_2$ | Coating | 3.5 | Silicone-based | Coating | 16 | Silicone-based |
| Comparative Example 8 | 250 | White/Readily Adherable Layer | TiO$_2$ | Coating | 3.5 | Silicone-based | Coating | 18 | Silicone-based |

TABLE 1-continued

|  | Second Polymer Layer Polymer Layer 3 [Top Layer] | | Evaluation | | | | | |
|---|---|---|---|---|---|---|---|---|
|  | | | 1 | 2 Adhesion to | | 3 | 4 Conditions | 5 Retention of |
|  | Formation Method | Thickness [μm] | Reflectance Color [%] | Encapsulant [Fr] | [PC] | Warpage | after Heat Aging | Elongation at Break [%] |
| Example 1 | Coating | 2.5 | White | 74 | 5 | 5 | 4 | No Change | 77 |
| Example 2 | Coating | 2.5 | Blue | — | 5 | 5 | 4 | No Change | 77 |
| Example 3 | Coating | 2.5 | Black | — | 5 | 5 | 4 | No Change | 77 |
| Example 4 | Coating | 2.5 | White | 74 | 5 | 5 | 4 | No Change | 77 |
| Example 5 | Coating | 2.5 | Blue | — | 5 | 5 | 4 | No Change | 77 |
| Example 6 | Coating | 2.5 | Black | — | 5 | 5 | 4 | No Change | 77 |
| Comparative Example 1 | None | | White | 72 | 5 | 2 | 1 | Separation of Adhesive Layer | 77 |
| Comparative Example 2 | Coating | 2.5 | — | — | 2 | 1 | 4 | No Change | 77 |
| Example 7 | Coating | 2.5 | White | 74 | 5 | 4 | 3 | No Change | 84 |
| Example 8 | Coating | 2.5 | White | 74 | 5 | 5 | 4 | No Change | 81 |
| Example 9 | Coating | 2.5 | White | 74 | 5 | 5 | 4 | No Change | 76 |
| Comparative Example 3 | Coating | 2.5 | White | 38 | 3 | 2 | 4 | No Change | 77 |
| Example 10 | Coating | 2.5 | White | 74 | 5 | 5 | 4 | No Change | 77 |
| Example 11 | Coating | 2.5 | White | 74 | 5 | 5 | 4 | No Change | 77 |
| Example 12 | Coating | 2.5 | White | 74 | 5 | 5 | 3 | No Change | 77 |
| Comparative Example 4 | Coating | 2.5 | White | 74 | 5 | 3 | 2 | No Change | 77 |
| Comparative Example 5 | Coating | 2.5 | White | 74 | 4 | 2 | 2 | No Change | 77 |
| Comparative Example 6 | Coating | 0.1 | White | 74 | 5 | 2 | 4 | No Change | 77 |
| Example 13 | Coating | 2.5 | White | 74 | 5 | 5 | 4 | No Change | 77 |
| Example 14 | Coating | 6.0 | White | 74 | 5 | 5 | 3 | No Change | 77 |
| Comparative Example 7 | Coating | 10 | White | 74 | 5 | 3 | 2 | No Change | 77 |
| Comparative Example 8 | Coating | 16 | White | 74 | 5 | 3 | 1 | No Change | 77 |

The "Color" in the "Evaluation" in Table 1 indicates the color of the first polymer layer.

As shown in Table 1, Examples did not exhibit separation of the polymer layers from the encapsulant and/or the support after hot-pressing or heat damp aging and warpage of the backsheet. Further, the backsheets in Examples which included the first polymer layer including the white pigment were found as having good reflectance.

Example 15

<Production of Solar Cell Module>

A reinforced glass having a thickness of 3 mm, an EVA sheet (trade name: SC 50B, manufactured by Mitsui Chemicals Fabro, Inc.), a crystalline photovoltaic element (cell), an EVA sheet (trade name: SC 50B manufactured by Mitsui Chemicals Fabro, Inc.), and the backsheet 1 in Example 1 were layered in this order, and the layers in the resultant were bonded together by hot pressing in a vacuum laminator manufactured by Nisshinbo Mechatronics Inc. Note that the backsheet was disposed to contact the readily adherable layer (first polymer layer) with the EVA sheet. The following bonding conditions were used.

A vacuum was drawn at 128° C. for 3 minutes with the vacuum laminator, and pressure was applied for 2 minutes to temporarily bond the layers. Then the bonded layers were fully bonded in a dry oven at 150° C. for 30 minutes.

In this way, a crystalline solar cell module 1 was produced.

Further, crystalline solar cell modules 2 to 14 were produced by using the backsheets 2 to 14 respectively in place of the backsheet 1.

When the produced solar cell modules 1 to 14 were used to generate electric power, all of the solar cells exhibited good electricity generation performance.

Disclosure of Japanese Patent Application No. 2010-254208 is incorporated herein by reference in its entirety.

All publications, patents, patent applications, and technical specifications described herein are incorporated herein by reference to the same extent as if individual publication, patent, patent application and technical specification was specifically and individually indicated to be incorporated by reference.

INDUSTRIAL APPLICABILITY

The present invention can provide a solar cell backsheet which is less likely to warp even under hot-pressing and/or damp heat aging and which includes a polymer layer less likely to separate from an encapsulant and/or its support, a method for producing the backsheet, and a solar cell module which has a high yield.

What is claimed is:
1. A backsheet for a solar cell, the backsheet comprising:
   a support which has a thickness of 120 μm to 350 μm and which has a ratio of an elongation at break after 50 hours of storage at 120° C. and 100% RH, to an elongation at break before the storage, of 77% or more;
   a first polymer layer which is formed on one surface of the support by coating, which comprises a polymer, and which has a thickness of 0.5 μm to 12.0 μm; and
   a second polymer layer which is formed on a surface on an opposite side from the surface of the support on which the first polymer layer is provided by coating, which comprises a fluorinated resin or a silicone-based resin, and which has a thickness of 0.2 μm to 15.0 μm.

2. The backsheet according to claim 1, wherein the support comprises a polyester.

3. The backsheet according to claim 1, wherein a surface of the backsheet at which the first polymer layer is provided with has a light reflectance at 550 nm of 72% or more.

4. The backsheet according to claim 1, wherein the support has a thickness of 160 μm to 320 μm.

5. The backsheet according to claim 1, wherein the first polymer layer has a thickness of 1 pm to 10 μm.

6. The backsheet according to claim 1, wherein the second polymer layer has a thickness of 0.5 μm to 12 μm.

7. The backsheet according to claim 1,
wherein the support has a thickness of 160 μm to 320 μm,
wherein the first polymer layer has a thickness of 1 μm to 10 μm, and
wherein the second polymer layer has a thickness of 0.5 μm to 12 μm.

8. The backsheet according to claim 1 wherein the polymer which is included in the first polymer layer comprises at least one selected from the group consisting of a vinyl alcohol resin, an olefin resin, and an acrylic resin.

9. The backsheet according to claim 1, wherein the second polymer layer comprises the silicone-based resin, and wherein the silicone-based resin is a composite polymer of a silicone resin and an acrylic resin.

10. The backsheet according to claim 1, wherein all layers which constitute the backsheet except for the support are formed by coating.

11. The backsheet according to claim 1, wherein:
the support has a thickness of 160 μm to 320 μm;
the first polymer layer has a thickness of 1 μm to 10 μm;
the second polymer layer has a thickness of 0.5 μm to 12 μm;
the support comprises a polyester;
the polymer which is included in the first polymer layer comprises at least one selected from the group consisting of a vinyl alcohol resin, an olefin resin, and an acrylic resin;
the second polymer layer comprises the silicone-based resin, and wherein the silicone-based resin is a composite polymer of a silicone resin and an acrylic resin;
a surface of the backsheet at which the first polymer layer is provided with has a light reflectance at 550 nm of 72% or more; and
the support has a ratio of an elongation at break after 50 hours of storage at 120° C. and 100% RH, to an elongation at break before the storage, of 77% or more.

12. A solar cell module comprising the backsheet according to claim 1, a photovoltaic element, and an encapsulant which encapsulates the photovoltaic element.

13. The solar cell module according to claim 12, wherein the encapsulant comprises ethylene-vinyl acetate.

14. A method for producing the backsheet according to claim 1, comprising:
coating a first coating liquid which comprises a polymer on one surface of a support having a thickness of 120 μm to 350 μm to form a first polymer layer having a thickness of 0.5 μm to 12.0 μm; and
coating a second coating liquid which comprises a fluorinated resin or a silicone-based resin on a surface on an opposite side from the surface of the support on which the first polymer layer is provided to form a second polymer layer having a thickness of 0.2 μm to 15.0 μm.

15. The method according to claim 14, wherein all layers which constitute the backsheet except for the support are formed by coating.

16. The backsheet according to claim 1, wherein the first polymer layer has a thickness of 0.5 μm to 8.0 μm.

17. The backsheet according to claim 1, wherein the second polymer layer consists of two or more layers and the layer closest to the support has a thickness of 0.2 μm to 3.0 μm.

* * * * *